United States Patent
Suzuki et al.

(10) Patent No.: US 6,730,885 B2
(45) Date of Patent: May 4, 2004

(54) BATCH TYPE HEAT TREATMENT SYSTEM, METHOD FOR CONTROLLING SAME, AND HEAT TREATMENT METHOD

(75) Inventors: Fujio Suzuki, Tokyo-To (JP); Wenling Wang, Tokyo-To (JP); Koichi Sakamoto, Tokyo-To (JP); Moyuru Yasuhara, Tokyo-To (JP); Sunil Shah, Los Altos, CA (US); Pradeep Pandey, San Jose, CA (US)

(73) Assignee: Tokyo Electron Limited, Tokyo-To (JP)

( * ) Notice: Subject to any disclaimer, the term of this patent is extended or adjusted under 35 U.S.C. 154(b) by 150 days.

(21) Appl. No.: 09/897,908

(22) Filed: Jul. 5, 2001

(65) Prior Publication Data

US 2002/0014483 A1 Feb. 7, 2002

(30) Foreign Application Priority Data

Jul. 6, 2000 (JP) ....................... 2000-204592

(51) Int. Cl.$^7$ ............................. H05B 3/02; F26B 19/00
(52) U.S. Cl. ....................... 219/486; 392/416
(58) Field of Search ..................... 219/483, 486, 219/497, 502; 392/416, 418, 419; 432/53, 120, 128; 373/109, 135, 136

(56) References Cited

U.S. PATENT DOCUMENTS

| | | | |
|---|---|---|---|
| 4,605,161 A | * 8/1986 | Motomiya et al. | 236/15 BC |
| 5,112,641 A | * 5/1992 | Harada et al. | 438/542 |
| 5,517,591 A | 5/1996 | Wagman et al. | |
| 5,517,594 A | 5/1996 | Shah et al. | 392/416 |
| 5,593,608 A | * 1/1997 | Suzuki | 219/492 |
| 5,616,264 A | * 4/1997 | Nishi et al. | 219/494 |
| 5,622,639 A | * 4/1997 | Kitayama et al. | 219/390 |
| 6,306,764 B1 | * 10/2001 | Kato et al. | 438/660 |

FOREIGN PATENT DOCUMENTS

| | | |
|---|---|---|
| JP | 58-31405 | 2/1983 |
| JP | 59-108119 | 6/1984 |
| JP | 61-63034 | 4/1986 |
| JP | 63-311722 | 12/1988 |
| JP | 2-156632 | 6/1990 |
| JP | 3-145121 | 6/1991 |
| JP | 5-267200 | 10/1993 |
| JP | 5-291143 | 11/1993 |
| JP | 6-5682 | 1/1994 |
| JP | 7-283158 | 10/1995 |
| JP | 10-189465 | 7/1998 |
| JP | 2000-195809 | 7/2000 |
| JP | 2000-340554 | 12/2000 |
| JP | 2001-144019 | 5/2001 |

* cited by examiner

*Primary Examiner*—Sang Paik
(74) *Attorney, Agent, or Firm*—Smith, Gambrell & Russell, LLP

(57) ABSTRACT

There is provided a batch type heat treatment system, control method and heat treatment method capable of appropriately coping with a multi-product small-lot production.

A reaction tube 2 comprises a plurality of heaters 31 through 35 and a plurality of temperature sensors, and houses therein a wafer boat 23. A control part 100 stores therein many mathematical models for estimating (calculating) the temperature of wafers W in the reaction tube 2, in accordance with the number and arranged position of the wafers W mounted on the wafer boat 23, and many target temperature trajectories. If the wafer boat 23 is loaded in the reaction tube 2, a mathematical model and a target temperature trajectory corresponding to the number and arranged position of the mounted wafers W are read. If a deposition process is started, the output of a temperature sensor S and the model are used for estimating the temperature of the wafers W in the reaction tube 2, and the powers to be supplied to the heaters 31 through 35 are separately controlled so that the estimated temperature approaches the target temperature trajectory.

17 Claims, 5 Drawing Sheets

BATCH TYPE HEAT TREATMENT SYSTEM, METHOD FOR CONTROLLING SAME, AND HEAT TREATMENT METHOD

BACKGROUND OF THE INVENTION

1. Field of the Invention

The present invention relates generally to a batch type heat treatment system for collectively heat-treating a large number of objects to be processed, such as semiconductor wafers. More specifically, the invention relates to an adaptive controlled batch type heat treatment system for estimating the temperatures of semiconductor wafers, which are housed therein, to carry out the optimum control on the basis of the estimated results, a method for controlling the system, and a heat treatment method using the system.

2. Description of Related Background Art

As batch type heat treatment systems for collectively carrying out a heat treatment, such as deposition, oxidation or diffusion, with respect to a large number of semiconductor wafers, horizontal heat treatment systems and vertical heat treatment systems are known. Recently, vertical heat treatment systems are being mainly used on the grounds that the amount of the drawn atmosphere is small and so forth.

Figure 5:
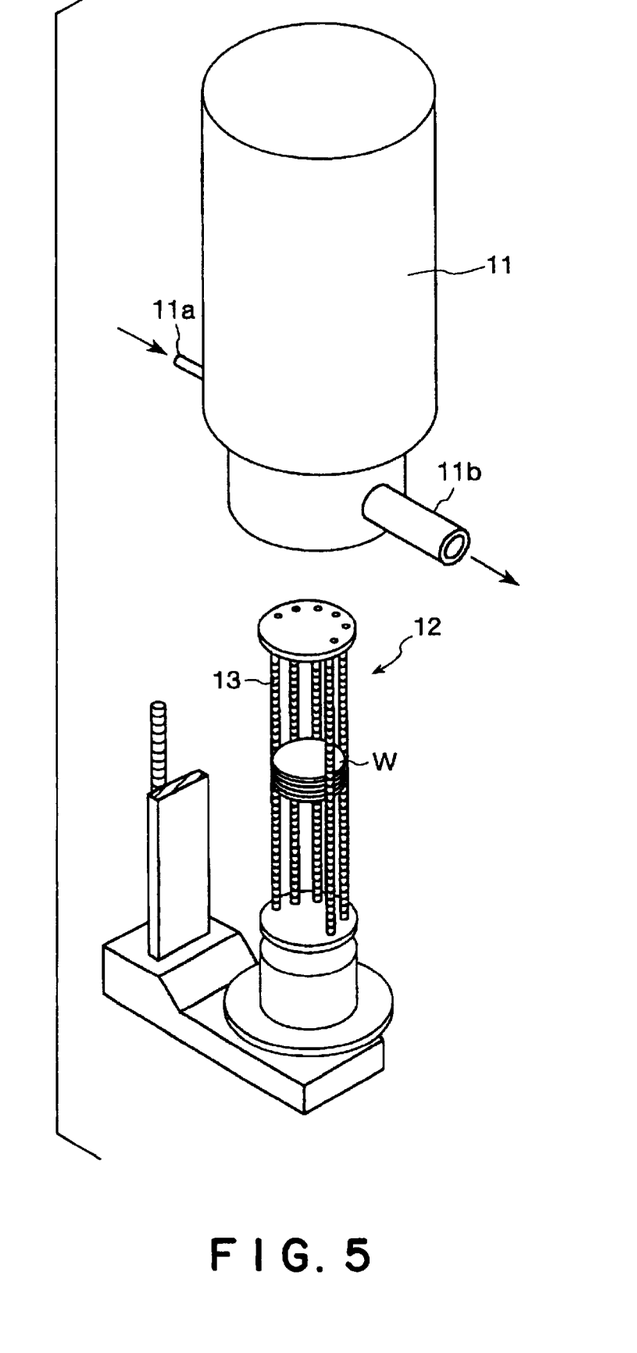
FIG. 5 is a perspective view of a conventional heat treatment system.

FIG. 5 shows the appearance of a vertical heat treatment system. This system comprises a vertical heating furnace 11 and a wafer boat 12 serving as a wafer holder. The heating furnace 11 comprises a heater which is provided around a vertical reaction tube. The heating furnace 11 is connected to a gas supply pipe 11a and an exhaust pipe 11b.

The wafer boat 12 comprises a plurality of struts 13 having grooves in which the peripheral portions of a large number of wafers W are supported so that the wafers W are held at regular intervals in the form of shelves. After the wafer boat 12 supports the large number of wafers W, the wafer boat 12 is carried in the heating furnace 11 through a bottom opening of the heating furnace 11, and a predetermined heat treatment is carried out with respect to the wafers W.

In a control system for such a heat treatment system, process conditions (target values of process parameters), such as a process pressure, a process temperature and a gas flow rate, have been determined in accordance with, e.g., the kind and thickness of a thin film to be deposited, and a plurality of recipes in which these process conditions have been written have been prepared. If each operator selects one of the recipes in accordance with the kind and thickness of a thin film, the heat treatment system is operated on the basis of predetermined process conditions. Such recipes are prepared by actually fully loading wafers W in the wafer boat 12, carrying out a heat treatment and finding the optimum process conditions.

Recently, various semiconductor devices are required. Therefore, there are some cases where it is required to carry out a heat treatment with respect to a small lot of wafers of various kinds. For example, when it is required to process 150 product wafers as the full number (the full load number) of wafers, the wafer boat 12 is in a full load state. There are some cases where it is required to heat-treat a smaller number of wafers than the full load number, e.g., 100, 50 or 25 wafers. In such cases, a short number of dummy wafers are used for fully loading wafers in the wafer boat 12 to carry out a heat treatment on usual process conditions during the wafer full load.

Since the dummy wafers are expensive, the dummy wafers are cleaned every a plurality of processes to be repeatedly used. However, the dummy wafers are finally discarded to cause the rising of running costs.

Although the number of product wafers is small, it takes a lot of time to transfer dummy wafers, so that it is also a waste of time from the point of through put.

When the batch size is small (when the number of product wafers is smaller than the full number), if the process is carried out without the need of dummy wafers, an empty region in which no wafer is loaded exists in the wafer boat 12. In this case, the temperature of the wafers and the concentration of gas are partially disturbed to vary the wafer inplane uniformity, interplane uniformity and process speed in the heat treatment to deteriorate the repeatability of the heat treatment.

A typical batch type heat treatment system is designed to collectively process a large number of wafers. Therefore, it is not possible to finely control the process, so that there are some cases where wafer interplane and inplane variations are caused.

Conventionally, when wafers W and dummy wafers are fully loaded in the wafer boat 12 to heat-treat the wafers W, the temperature in the heat furnace 11 is measured to control the heater on the basis of the measured results. That is, conventionally, the temperatures of the wafers W themselves are not estimated in time series, and the heater is not controlled on the basis of the measured results so that the temperatures of the wafers W approach the target temperature values of the wafers W themselves. Therefore, conventionally, there is a problem in that it is not possible to precisely control the temperatures of the wafers W.

SUMMARY OF THE INVENTION

It is therefore an object of the present invention to eliminate the aforementioned problems and to provide a batch type heat treatment system capable of carrying out a good process even if a holder has an empty region in which no object to be processed is held, a method for controlling the heat treatment system, and a heat treatment method using the heat treatment system.

It is another object of the present invention to provide a batch type heat treatment system suitable for a multi-product small-lot production, a method for controlling the heat treatment system, and a heat treatment method using the heat treatment system.

It is a further object of the present invention to provide a batch type heat treatment system capable of suitably processing each of wafers even if the system is a batch type, a method for controlling the heat treatment system, and a heat treatment method using the heat treatment system.

In order to accomplish the aforementioned and other objects, according to a first aspect of the present invention, a batch type heat treatment system comprising: a heating furnace for housing therein objects to be processed; a plurality of heaters which are arranged for heating each of a plurality of regions of said heating furnace; a plurality of temperature sensors for detecting the temperature of each of said plurality of regions; a memory for storing therein a plurality of temperature estimating models, which have been prepared in accordance with the number and arranged position of said objects, for estimating the temperatures of said objects in said heating furnace, on the basis of outputs of said plurality of temperature sensors; and a controller for selecting a temperature estimating model corresponding to information on the number and arranged position of said objects to be housed in said heating furnace, from said plurality of temperature estimating models to estimate the temperatures of said objects from the outputs of said plurality of temperature sensors on the basis of the selected temperature estimating model, and for controlling said plurality of heaters so that the temperatures of said objects reach target temperature values in accordance with the estimation of the temperatures of said objects.

With this construction, model storing means stores therein a temperature estimating model according to the processed number and arranged position of the objects to be processed. By the outputs of the plurality of temperature sensors and the temperature estimating model, the temperatures of the objects can be estimated. That is, the temperatures of the objects themselves can be indirectly measured. By controlling the plurality of heaters in accordance with the estimated temperatures, heating and cooling can be carried out so that the variation in temperature of each of the wafers is appropriate.

Therefore, the objects can be appropriately and precisely heated regardless of the number and arrangement of the objects.

The temperature estimating model may have a plurality of sub-models for controlling the heaters while estimating the temperatures of the objects, in order to cause the estimated temperatures of the objects to approach the target temperature values.

The sub-models are set every temperature zone, and said controller selects one of said sub-models according to the temperatures of said objects.

The controller has a recipe memory for storing a temperature recipe indicative of a time-varying temperature pattern which is to be applied to said objects, and said controller estimates the temperatures of said objects on the basis of the selected temperature estimating model so that the temperatures of said objects vary in accordance with said temperature recipe stored in said recipe storing means, and controls said plurality of heaters in accordance with the estimated temperatures of said objects.

The recipe memory stores therein a plurality of temperature recipes which are prepared every number and arranged position of said objects, and
    said controller selects a temperature recipe corresponding to information on the number and arranged position of said objects to be housed in said heating furnace, from said plurality of temperature recipes to control said plurality of heaters in accordance with the selected temperature recipe.

The space in said heating furnace is divided into a plurality of partial zones in arranged directions of said objects, said temperature recipe comprises a plurality of sub-recipes which are prepared every one of said plurality of partial zones which are obtained by dividing the space in said heating furnace in the arranged directions of said objects, and
    said controller controls said plurality of heaters in accordance with said sub-recipes corresponding to each of said partial zones.

The controller controls said plurality of heaters so that the difference between a set of wafer temperatures, which have been estimated referring to said temperature estimating models, and a set of temperatures, which are indicated by said sub-recipes of said plurality of partial zones, is minimum.

The information on the number and arranged position of said objects is inputted from an operation panel.

The information on the number of said objects is automatically acquired by a number counter for counting the number of said objects.

According to a second aspect of the present invention, there is provided a method for controlling a batch type heat treatment system comprising a furnace for housing therein objects to be processed, a plurality of heaters which are arranged for heating each of a plurality of regions of said heating furnace, and a plurality of temperature sensors for detecting the temperature of each of said plurality of regions, said method comprising: a model storing step of storing therein a plurality of temperature estimating models, which have been prepared in accordance with the number and arranged position of said objects, for estimating the temperatures of said objects in said heating furnace from the outputs of said plurality of temperature sensors; an information acquiring step of acquiring information on the number and arranged position of said objects to be housed in said heating furnace; a temperature estimating step of selecting a temperature estimating model corresponding to the acquired information, from said plurality of temperature estimating model to estimate the temperatures of said objects from the outputs of said plurality of temperature sensors on the basis of the selected temperature estimating model; and
    a heater control step of controlling said plurality of heaters in accordance with the estimation of the temperatures of said objects so that the temperatures of said objects equal target temperature values.

Each of said temperature estimating models has a plurality of sub-models for controlling the heaters while estimating the temperature of the objects, in order to cause the estimated temperatures of said objects to approach said target temperature values, and said sub-models are set every temperature zone, and
    said temperature estimating step selects one of said sub-models corresponding to the temperatures of said objects.

The space in said heating furnace is divided into a plurality of partial zones in arranged directions of said objects, said temperature recipe comprises a plurality of sub-recipes which are prepared every one of said plurality of partial zones which are obtained by dividing the space in said heating furnace in the arranged directions of said objects, and
    said heater control step controls said plurality of heaters in accordance with said sub-recipes corresponding to each of said partial zones.

The heater control step controls said plurality of heaters so that the difference between a set of wafer temperatures, which have been estimated referring to said temperature estimating models, and a set of temperatures, which are indicated by said sub-recipes of said plurality of partial zones, is minimum.

According to a third aspect of the present invention, there is provided a heat treatment method using a batch type heat treatment system having a furnace for housing therein objects to be processed, a plurality of heaters which are arranged for heating each of a plurality of regions of said heating furnace, and a plurality of temperature sensors for detecting the temperature of each of said plurality of regions, said heat treatment method comprising: a model reading step of selecting and reading a temperature estimating model corresponding to information on the number and arranged position of said objects housed in said heating furnace, from a model memory for storing therein a plurality of temperature estimating models, which have been prepared in accordance with the number and arranged position of said objects, for estimating the temperatures of said objects in said heating furnace; a recipe reading step of reading a temperature recipe corresponding to the kind of a heat treatment, which is to be carried out with respect to said objects, from a recipe memory for storing therein a plurality of temperature recipes indicative of a time-varying temperature pattern which is to be applied to said objects; a temperature estimating step of estimating the temperatures of said objects from the outputs of said plurality of temperature sensors on the basis of the temperature estimating model which has been read at said model reading step; and a heater control step of controlling said plurality of heaters so that the temperatures of said objects estimated at said temperature estimating step equal target temperature values indicated by the read temperature recipe.

Each of said temperature estimating models has a plurality of sub-models for controlling the heaters while estimating the temperature of the objects, in order to cause the estimated temperatures of said objects to approach said target temperature values, and said sub-models are set every temperature zone, and said model reading step selects one of said sub-models corresponding to the temperatures of said objects.

Furthermore, mathematical models for executing the above described batch type heat treatment system controlling method and heat treatment method may be stored in ROMs, flash memories and so forth to be mounted in the batch type heat treatment system or distributed.

BRIEF DESCRIPTION OF THE DRAWINGS

The present invention will be understood more fully from the detailed description given herebelow and from the accompanying drawings of the preferred embodiments of the invention. However, the drawings are not intended to imply limitation of the invention to a specific embodiment, but are for explanation and understanding only.

In the drawings.

DESCRIPTION OF THE PREFERRED EMBODIMENTS

Referring now to the accompanying drawings, a preferred embodiment of a batch type heat treatment system according to the present invention, which is applied to a vertical heat treatment system, will be described below.

Figure 1:
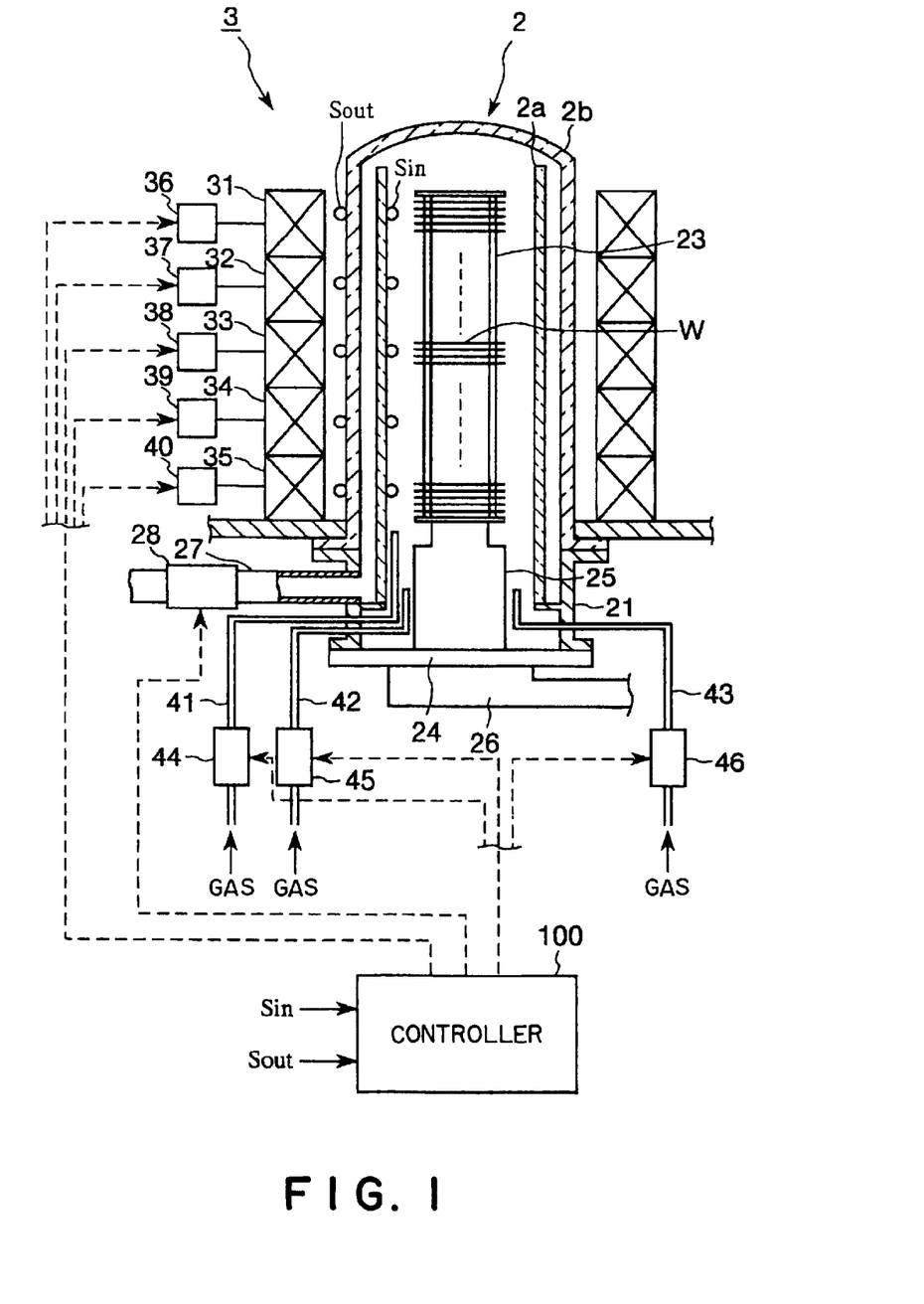
FIG. 1 is a diagram showing the construction of a preferred embodiment of a heat treatment system according to the present invention.

As shown in FIG. 1, this vertical heat treatment system comprises a reaction tube 2 having a double tube structure which comprises an inner tube 2a and outer tube 2b of, e.g., quartz, and a cylindrical metal manifold 21 which is provided below the reaction tube 2.

The top end of the inner tube 2a is open, and the inner tube 2a is supported on the manifold 21. The outer tube 2b has a ceiling, and the bottom end of the outer tube 2b is airtightly connected to the top end of the manifold.

In the reaction tube 2, a large number of, e.g., 150, wafers W (product wafers) serving as objects to be processed, are horizontally arranged on a wafer boat 23 serving as a wafer holder at vertical regular intervals in the form of shelves. The wafer boat 23 is held on a lid 24 via a heat reserving cylinder (heat insulating body) 25.

Around the reaction tube 2, a heater 3 of, e.g., a resistor. The heater 3 comprises heaters 31 through 35 arranged in five stages. To the heaters 31 through 35, power is independently supplied by power controllers 36 through 40, respectively. The reaction tube 2, the manifold 21 and the heater 3 constitute a heating furnace.

The manifold 21 is provided with a plurality of supply pipes for supplying gas into the inner tube 2a. In order to facilitate understanding, only three gas supply pipes 41, 42 and 43 are shown in FIG. 1. To the gas supply pipes 41, 42 and 43, dichlorosilane, ammonia and nitrogen are supplied via flow control parts 44, 45 and 46, such as mass flow controllers (MFCs), for controlling the flow rates of gases, respectively. The manifold 21 is connected to an exhaust pipe 27 for exhausting gases from a gap between the inner tube 2a and the outer tube 2b. The exhaust pipe 27 is connected to a vacuum pump (not shown). The exhaust pipe 27 is provided with a pressure control part 28, which includes a combination valve, a butterfly valve and a valve driving part, for controlling the pressure in the reaction tube 2.

On the inside face of the inner tube 2a, five thermocouples (temperature sensors) Sin are aligned in vertical directions. To each of the five thermocouples Sin, name such as an identification number is given. The thermocouples Sin are covered with a pipe of, e.g., quarts, in order to prevent semiconductor wafers W from being contaminated with metals.

On the outside face of the outer tube 2b, a plurality of thermocouples (temperature measuring parts) Sout are aligned in vertical directions. To each of the plurality of thermocouples Sout, name such as an identification number is given.

This vertical heat treatment system is equipped with a control part 100 for controlling process parameters, such as the temperature in process atmosphere, the flow rates of gases and the pressures of gases in the reaction tube 2. This control part 100 is designed to receive detection signals from the plurality of thermocouples Sin and Sout to output control signals to the power controllers 36 through 40, the pressure control part 28 and the flow control parts 44 through 46.

Figure 2:
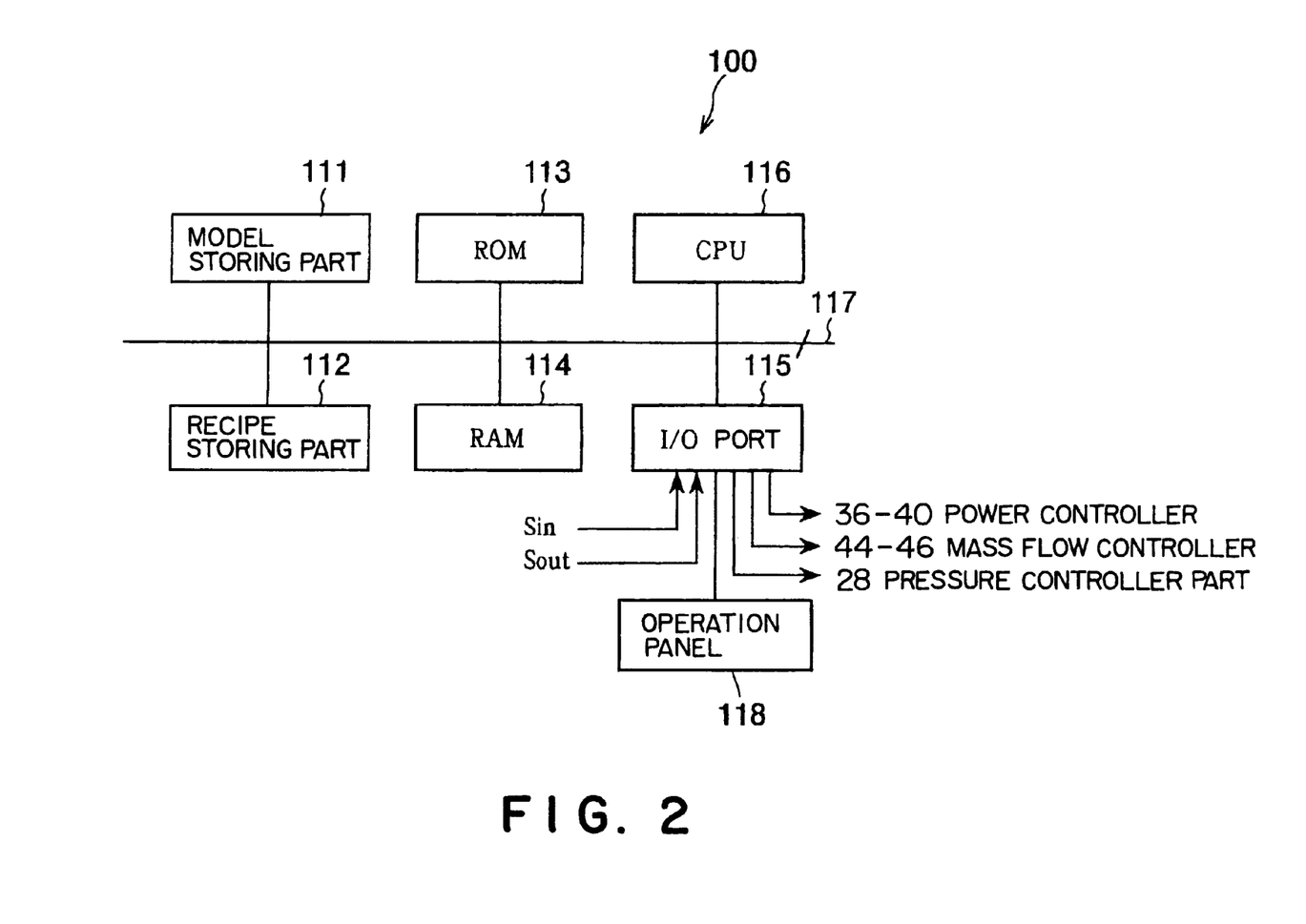
FIG. 2 is a block diagram showing an example of a control part.

FIG. 2 shows the construction of the control part 100.

As shown in FIG. 2, the control part 100 comprises a model storing part 111, a recipe storing part 112, a ROM 113, a RAM 114, an I/O port 115, a CPU 116 and a bus 117 for connecting them to each other.

The model storing part 111 stores therein a model (mathematical model: high multidimensional function) for estimating (calculating) the temperatures of wafers W, which are mounted on the wafer boat 23, on the basis of output signals (measured temperatures) from the plurality of thermocouples Sin and Sout and for indicating current to be supplied to the heaters 31 through 35 in order to set the estimated temperature to be a target value. Furthermore, a method for designing the model will be described later.

For example, as schematically shown in FIGS. 3(a) through 3(d), there is a case where wafers W are mounted on all of the shelves of the wafer boat 23, and there are some cases where wafers W are mounted on part of the shelves of the wafer boat 23 at different positions. There are also some cases where dummy wafers DW are arranged. Therefore, the model is designed to be previously stored so as to be capable of precisely estimating the temperatures of wafers W every the number and arrangement pattern of the wafers W processed by the heat treatment system and of guiding the temperatures to the target values. In the top and bottom portions of the wafer boat 23, side wafers SW are arranged.

Figure 3:
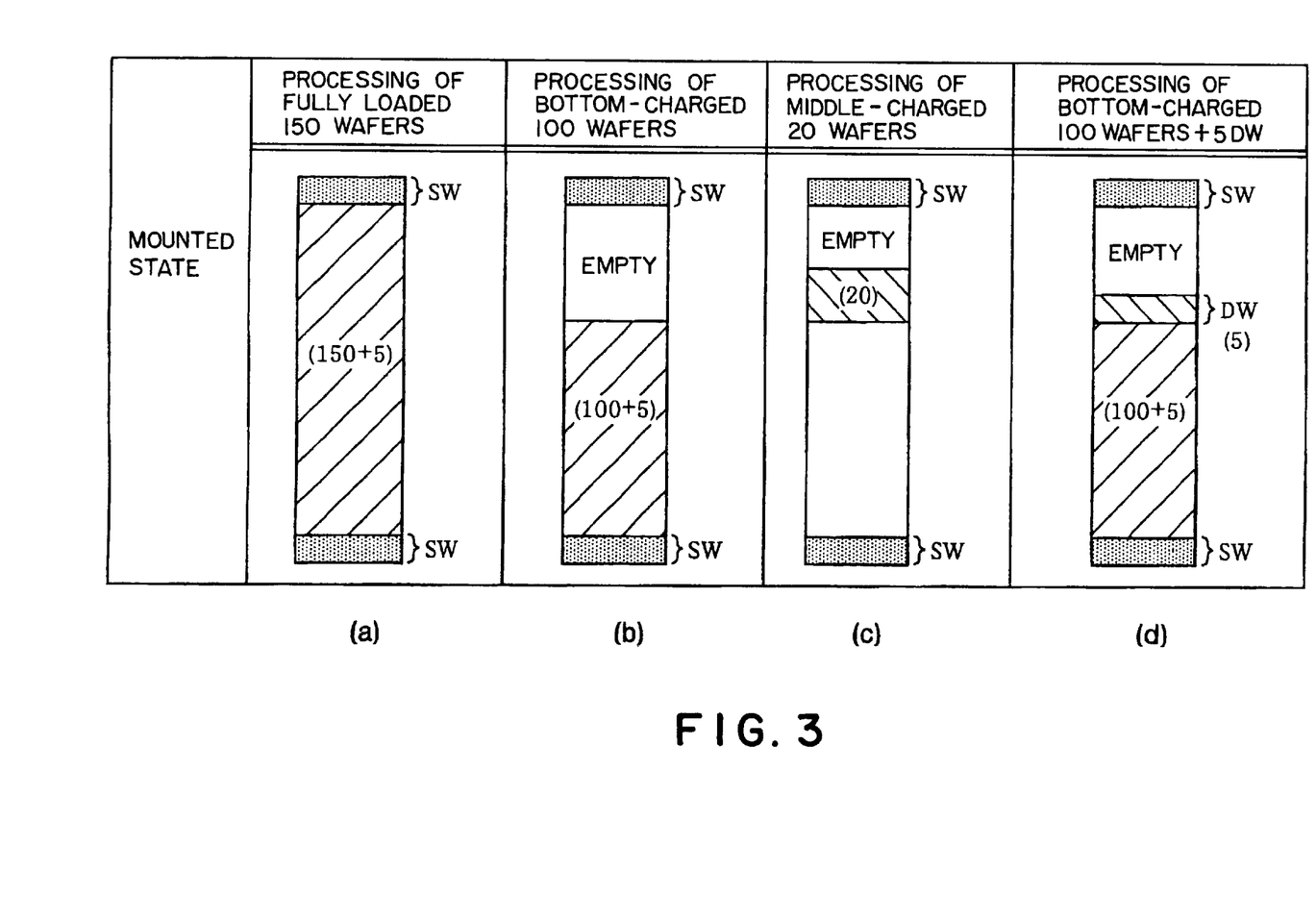
FIG. 3 is a diagram showing examples (a) through (d) of arrangements of wafers in a wafer boat.

For example, if wafers W are arranged as shown in FIGS. 3(a) through 3(d), it is possible to precisely estimate the temperatures by using temperature estimating models which have been designed every the number and arranged position of wafers W to be processed. The arranged position of the wafers W indicates where and how the wafers W are arranged in the reaction tube 2. By the processed number and arranged position, it is possible to identify various arrangement patterns as shown in FIGS. 3(a) through 2(d).

Figure 4A:
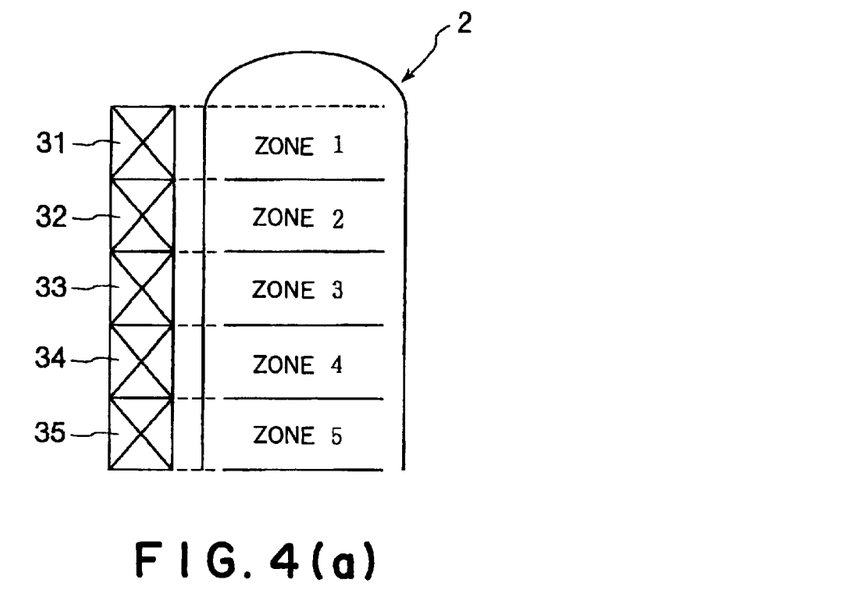
FIG. 4(A) is a diagram showing zones in a reaction tube.
Figure 4B:
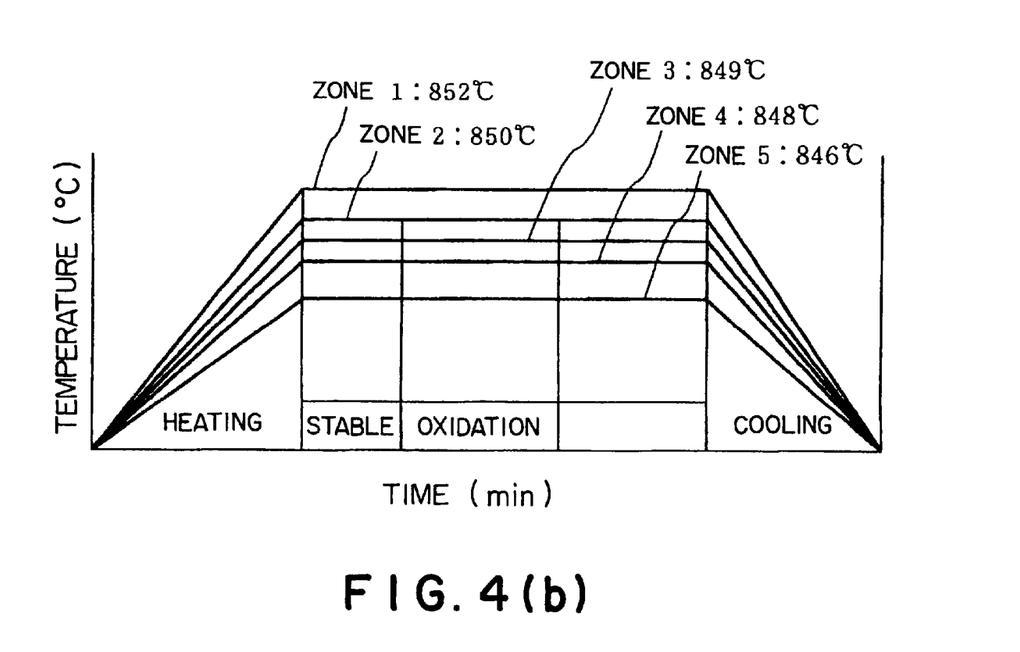
FIG. 4(B) is a diagram showing an example of target temperature trajectories every zone.

The recipe storing part 112 stores therein various process recipes (which will be also hereinafter referred to as recipes) for defining a control procedure, in accordance with the kind of a deposition process which is carried out in the heat treatment system. Each of the process recipes includes a temperature recipe. The process recipes include various recipes indicative of control guidance for other physical quantities such as the kind of gas and the pressure of gas, in addition to the temperature recipe. As shown in FIG. 4(B), the temperature recipe means information indicative of a time-varying temperature pattern as a control target.

In the case of a usual batch process, one temperature recipe is prepared for all of wafers. On the other hand, in this preferred embodiment, the interior of the reaction tube 2 is divided into five partial zones (five spaces defined by the heaters 31 through 35) in the arranged directions (vertical directions) of wafers Was shown in FIG. 4(A) so that the thickness of films is uniform in plane and between planes in accordance with the characteristics of individual heat treatment systems, and sub-recipes (temperature target trajectories) of the temperature recipe which are adjusted every partial zone in time series are prepared as shown in FIG. 4(B). The adjusted sub-recipes of the temperature recipe are adjusted so that the variation in thickness due to the difference in flow rate of gas and so forth can be absorbed by a temperature control. A method for designing the temperature recipe will be described later.

The ROM 113 is a recording media comprising an EEPROM, a flash memory, a hard disc or the like for storing an operating program for the CPU 116.

The RAM 114 functions as a work area for the CPU 116.

The I/O port 115 is designed to supply signals indicative of measured values from the plurality of thermocouples Sin and Sout to the CPU 116, and to output control signals from the CPU 116 to the respective parts. The I/O port 115 is connected to an operation panel 118.

The bus 117 is designed to transmit information between the respective parts.

The CPU 116 may be a DSP (digital signal processor) The CPU 116 is designed to execute a control program, which has been stored in the ROM 113, to control the operation of the heat treatment system in accordance with the recipe, which has been stored in the recipe storing part 112, on the basis of instructions from the operation panel 118.

Specifically, the CPU 116 is designed to select a corresponding temperature estimating model from a plurality of temperature estimating models, which have been stored in the model storing part 111, in accordance with information on the number and arranged position of wafers W to be processed in the wafer boat 23 inputted from the operation panel 118, to read the selected temperature estimating model, and to select a corresponding one of the plurality of recipes, which have been stored in the recipe storing part 112, to read the selected recipe. Then, the CPU 116 executes a process operation in accordance with the selected recipe. In particular, in this preferred embodiment, the CPU 116 is designed to incorporate measured values from the plurality of thermocouples Sin and Sout and instructed values to the power controllers 36 through 40 (or values indicative of powers supplied from the power controllers 36 through 40 to the heaters 31 through 35), to estimate the temperatures of wafers in time series every a predetermined sampling timing. Then, the CPU 116 instructs a power supply to the power controllers 36 through 40 so that the value instructed by the temperature recipe included in the selected recipe is coincident with the estimated value.

While information on the number and arranged position of wafers W to be processed has been inputted from the operation panel 118 in this preferred embodiment, the CPU 116 may acquire the number of wafers W to be processed from a wafer transfer part. In this case, for example, the number of wafers W to be processed may be recognized by means of a number counter which is provided in a part for conveying the wafers W. With respect to the arranged position of the wafers W, information whether the wafers W are arranged in the bottom portion of the wafer port 23 (upstream in the direction of the flow of the process gas) (bottom charging) or in the top portion of the wafer port 23 (downstream in the direction of the flow of the process gas) (top charging) may be selected in accordance with the contents of the process to be fed to the CPU 116. By thus automatically recognizing the number of wafers W to be processed, it is possible to avoid manual operations, such as input of information from the operation panel 119, even if the number of the wafers W to be processed varies, so that it is possible to automate the system.

Similar to the usual control of the heat treatment system, the CPU 116 is also designed to instruct the flow controllers 44 through 46 and the pressure control part 28.

A deposition process using the bath type heat treatment system with the above described construction will be described below.

First, a required number of product wafers (wafers to be processed) W are mounted on the wafer boat 23. In this embodiment, it is assumed that 100 wafers W are charged on the bottom as shown in FIG. 3(b).

After the wafer boat 23 is loaded in the reaction tube 2, the operator inputs the number (100) of the wafers W, the arranged position (bottom charge) and the contents of the process (the formation of a nitride film), by means of the operation panel 118. The CPU 116 responds to instructions to read a model and recipe for the arranged position of FIG. 3(b) from the model storing part 111 and the recipe storing part 112, respectively.

Furthermore, the arranged pattern of the wafers W in the wafer boat 23 is selected in accordance with the contents of the process as described above, and then, the CPU 116 may acquire the selected arranged pattern of the wafers W and acquire the number of the wafers W to be processed from the wafer transfer part.

Then, in accordance with the read process recipe, the heater 3 is energized to start temperature rise. Moreover, the CPU 116 applies the output signals of the plurality of thermocouples Sin and Sout for measuring the temperatures of the wafers in each of the five zones in the top, upper middle, middle, lower middle and bottom stages, to the model which has been read on the basis of information on the number and arranged position of the wafers to be processed. Then, the CPU 116 estimates the temperatures of the wafers in each of the five zones in the top, upper middle, middle, lower middle and bottom stages, and controls powers, which are to be supplied to the heaters 31 through 35, via the power controllers 36 through 40 in time series every a predetermined sampling timing so that the estimated temperatures are closest to the corresponding temperatures which have been set by the temperature recipe as a whole. That is, the CPU 116 adaptive-controls the temperatures of the wafers on the basis of the estimated temperatures of the wafers.

For example, if it is estimated (calculated) that the temperatures of the wafers in the five zones are Wt1, Wt2, Wt3, Wt4 and Wt5 and if the temperatures indicated by the recipe are Tt1, Tt2, Tt3, Tt4 and Tt5, the control is carried out so that the differences between actual temperatures (estimated temperatures) and corresponding target temperatures (temperatures indicated by the recipe) are minimum as a whole. For example, the powers to be supplied to the heaters 31 through 35 are individually controlled so that $(Wt1-Tt1)^2+(Wt2-Tt2)^2+(Wt3-Tt3)^2+(Wt4-Tt4)^2+(Wt5-Tt5)^2$ is minimum by means of the method of least squares.

In other words, the temperature of each of the wafers W is estimated in time series in accordance with the outputs of the thermocouples Sin and Sout, and the five heaters 31 through 35 are individually adaptive-controlled so that the derived temperatures of the wafers W are equal to the corresponding temperatures assigned by the predetermined temperature recipe.

After the temperature rise is completed, the adaptive control is continued so that the temperatures of the respective partial zones (top stage, upper middle stage, middle stage, lower middle stage, bottom stage) are maintained to be constant. If it is assumed that the variations in temperature shown in FIG. 4(b) are the temperature trajectories indicated by the temperature recipe for the arranged position shown in FIG. 3(b), the CPU 116 controls the powers so that the temperature in the top stage (zone 1) is 852° C., the temperature in the upper middle stage (zone 2) is 850° C., the temperature in the middle stage (zone 3) is 849° C., the temperature in the lower middle stage (zone 4) is 848° C. and the temperature in the bottom stage (zone 5) is 846° C.

After a sufficient time to stabilize the temperature in the reaction tube 2 elapses, a process gas is supplied to the reaction tube 2 to start a deposition process. Also during the deposition process, the temperature control is carried out so that the temperatures of the wafers W in each of the zones in the top, upper middle, middle, lower middle and bottom stages are closest to the set temperatures of the temperature recipe.

Therefore, with respect to the wafers W in each of the partial zones in the top, upper middle, middle, lower middle and bottom stages, the deposition process is carried out at apparently different temperatures. However, since the model and recipe have values adjusted so as to be capable of forming uniform films (valued adjusted by converting the influence of the variations in concentration of the deposition gas and in the number and arrangement of the wafers to be processed into heat) as will be described later, films having a relatively uniform thickness grow in plane and between planes.

After the deposition process is completed, the supply of the deposition gas is stopped, the interior of the reaction tube 2 is cooled, and the processed wafers 23 are unloaded.

In this batch type heat treatment system, models and recipes according to the number and arrangement of the product wafers W mounted on the wafer boat 23 have been prepared in the controlpart 100. Therefore,the control part 100 can read a model and recipe corresponding to the number and arrangement of the product wafers W mounted on the loaded wafer boat 23, to appropriately carry out the deposition process (heat treatment) by the adaptive control. By this adaptive control, the temperature of each of the wafers can be appropriately controlled even if no dummy wafer is used. Also if dummy wafers are used, it is possible to decrease the used number of expensive dummy wafers, and it is possible to carry out an appropriate temperature control. Therefore, it is possible to stably form films having a constant thickness regardless of the number and arranged position of wafers to be processed, so that it is possible to cope with small-lot products according to circumstances.

Since the temperature recipe is adjusted every partial zone so that the thickness is uniform in plane and between planes, it is possible to inhibit the occurrence of the difference in thickness due to the flow of gas, the distribution of the density of gas, the temperature gradient and so forth.

When the number and arranged position of wafers to be processed shown in FIGS. 3(a), 3(c) and 3(d) are selected, the same process operation is substantially carried out, except that the model and recipe read (selected) from the model storing part 111 and the recipe storing part 112 are different from the above described model and recipe.

A method for designing a model and a temperature recipe for estimating temperature will be described below.

As the model, an optional model (multivariable, multidimensional, multioutput functions) is available if it is a mathematical model capable of estimating the temperatures of the wafers W on the basis of the outputs (measured values) of the thermocouples Sin and Sout and the powers supplied to the heaters 31 through 35 and of identifying the powers to be supplied to the heaters 31 through 35 in order to cause the estimated five temperatures to approach the target temperatures as a whole.

As such a model, a model disclosed in, e.g., U.S. Pat. No. 5,517,594, may be used.

As an example, the model disclosed in U.S. Pat. No. 5,517,594 will be described below.

First, five test wafers in which thermocouples Swc and Swe are incorporated at the center and a position spaced from the center by, e.g., 6 mm, are prepared. Then, the test wafers and usual wafers are mounted on the wafer boat 23 so that the five test wafers are positioned in the five zones of FIG. 4(B), respectively. The wafer boat 23 is then loaded in the reaction tube 2. Then, signals of a high frequency band and signals of a low frequency band are applied to the heaters 31 through 35 to acquire data on the outputs of the thermocouples Sin and Sout, the outputs (wafer temperatures) of the thermocouples Swc and Swe on the test wafers, and the current to be supplied to the heaters, in a sampling cycle of, e.g., 1 to 5 seconds.

Then, temperature zones are set at intervals of 100° C. in a predetermined temperature range, e.g., in a range of from 400° C. to 1100° C. (because the estimation of temperatures and so forth are inaccurate if a wide temperature zone is covered with a single model).

From the acquired data, an ARX (auto-regressive exogenous) model expressed by expression 1 is set with respect to each of the temperature zones:

$$y_t + AA_1 y_{t-1} + AA_2 y_{t-2} + \ldots + AA_n y_{t-n} = BB_1 U_{t-1} + BB_2 U_{t-2} + \ldots + BB_n U_{t-n} + e_t \quad (1)$$

wherein $y_t$ denotes a vector of p×1 including the following contents as components at time t (Contents: the variable quantities of the outputs of the thermocouples Sin (in this example, five components since the five thermocouples Sin exist), the variable quantities of the outputs of the thermocouples Sout (in this example, five components since the five thermocouples Sout exist), the variable quantities of the outputs of the thermocouples Swc set at the central portions of the wafers (five in this example), and the variable quantities of the outputs of the thermocouples Swe set at the peripheral portions of the wafers (five in this example). Therefore, in this example, $y_t$ is a vector of 20×1).

In the above described expression (1), $u_t$ denotes a vector of m×1 including the variable quantities of the heater powers as components (in this example, 5×1 since the number of the heaters is five), $e_t$ denotes a vector of m×1 including white noises as components, n denotes a lag (e.g., 8), $AA_1$ through $AA_n$ denote a matrix of p×p (in this example, 20×20), and $BB_1$ through $BB_n$ denote a matrix of p×m (in this example, 20×5).

The respective coefficients $AA_1$ through $AA_n$ and $BB_1$ through $BB_{nn}$ are determined using the method of least squares or the like.

If the ARX model relationship is applied to the state space method, its basic equation is expressed by expression 2:

$$X_{t+1} = Ax_t + Bu_t + K_f e_t \qquad (2)$$
$$y_t = Cx_{t+1} + e_t$$

wherein x denotes a variable of state, K denotes a feedback system of a Kalman filter, and A, B and C denote matrices.

In order to improve the processing speed during the actual deposition, the degree is decreased to about ten degree, and a mathematical model is prepared from expression 2 every temperature zone.

Thus, expression 3 for deriving the temperatures of the wafers from the inputs (Sin, Sout and heater power P) is derived every temperature zone.

$$X^{\hat{}}_{t+1} = Ax^{\hat{}}_t + B(Pinput, t + ubias) + L(Thermocouple, t - Csx^{\hat{}}_t + Sbias)$$
$$Tmodel, t = Cwx^{\hat{}}_t + Wbias \qquad (3)$$

Then, the test wafers are processed again, and the wafer temperature Tmodel estimated on the basis of expression 3 is compared with the measured value Twafer to carry out the tuning of the model. This tuning operation is repeated a plurality of times if necessary.

On the other hand, with respect to the operation program for the CPU 116, the operation is set so that the time mean of the variations in wafer temperature estimated from the set values of temperatures is minimum.

Moreover, in accordance with the kind of the deposition process, the target temperature trajectory Ttraj(t), i.e., the temperature recipe, is designed so that a uniform deposition process can be carried out in each of the zones.

Subsequently, a test deposition process is carried out by controlling all of the five zones so that the zones follow the target temperature trajectory. After the process, the thickness of deposited films is measured, the variation in thickness and so forth are checked.

For example, if the thickness of the film on the wafer in the top stage is smaller than that in the bottom stage, the thickness can be substantially equalized by relatively raising the temperature in the top stage, even if direct causes are not clear. Therefore, the target temperature trajectory Ttraj (t) is modified by the method of least squares so that the variation is minimum. This is the temperature recipe every zone shown in FIG. 4(B). This temperature recipe may be further tuned.

Thus, in accordance with the processed number and arrangement of the wafers, the model and recipe for estimating the temperatures of the wafers and for defining the outputs using the temperatures of the wafers as the target temperatures are set to be stored in the model storing part 111 and the recipe storing part 112, respectively.

Thereafter, during an actual deposition process, the model and recipe are suitably selected and read to be used for control.

While the batch type heat treatment system in this preferred embodiment, the method for adaptive-controlling the system, and the method for designing the model and recipe for use in the control have been described above, the present invention should not be limited thereto, but the invention may be modified and applied in various ways.

For example, while the thermal CVD system for forming nitride films has been used as an example in the above described preferred embodiment, the kind of process may be optionally selected, and the present invention may be applied to various batch type heat treatment systems, such as CVD systems for forming other kinds of films, oxidation systems and etching systems. However, the model and recipe are designed every kind of films.

The construction and operation of the system should not be limited to the above described preferred embodiment. For example, while the number of the heaters has been five and the number of the zones in the reaction tube 2 has been five in the above described preferred embodiment, the number of heaters and the number of temperature zones may be optionally selected. In addition, the heater should not be limited to the electrical resistance type heater, but it may be a lamp. Moreover, the constructions for measuring temperatures should not be limited to the thermocouples, but optional temperature sensors may be used.

The model and its design method should not be limited to the model and its design method disclosed in U.S. Pat. No. 5,517,594, but optional model and design method may be adopted.

It is complicated to individually design the models with respect to all of the systems. Therefore, one model and/or recipe is prepared with respect to heat treatment systems of the same specification, and this is optimized every system to commonly use the model and/or recipe. According to this method, it is possible to efficiently carry out the preparation and tuning of the model.

As described above, according to the present invention, a batch type heat treatment system can appropriately carry out a process even if objects to be processed, the processed number and arrangement of which are different, are housed in a heating furnace.

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A batch type heat treatment system comprising:
   a heating furnace for housing stationary objects to be processed;
   a plurality of heaters which are arranged for heating each of a plurality of regions of said heating furnace;
   a plurality of temperature sensors for detecting the temperature of each of said plurality of regions;

a memory for storing therein a plurality of temperature estimating models, which have been prepared in accordance with the number and arranged position of said objects, for estimating the temperatures of said objects in said heating furnace, on the basis of outputs of said plurality of temperature sensors; and a controller for selecting a temperature estimating model corresponding to information on the number and arranged position of said objects to be housed in said heating furnace, from said plurality of temperature estimating models to estimate the temperatures of said objects from the outputs of said plurality of temperature sensors on the basis of the selected temperature estimating model, and for controlling said plurality of heaters so that the temperatures of said objects reach target temperature values in accordance with the estimation of the temperatures of said objects.

2. A batch type heat treatment system as set forth in claim 1, wherein said temperature estimating model has a plurality of sub-models for controlling said heaters while estimating the temperature of the objects, in order to cause the estimated temperatures of said objects to approach said target temperature values.

3. A batch type heat treatment system as set forth in claim 2, wherein said sub-models are set every temperature zone, and said controller selects one of said sub-models according to the temperatures of said objects.

4. A batch type heat treatment system as set forth in claim 1, wherein said controller has a recipe memory for storing a temperature recipe indicative of a time-varying temperature pattern which is to be applied to said objects, and said controller estimates the temperatures of said objects on the basis of the selected temperature estimating model so that the temperatures of said objects vary in accordance with said temperature recipe stored in said recipe memory, and controls said plurality of heaters in accordance with the estimated temperatures of said objects.

5. A batch type heat treatment system as set forth in claim 4, wherein said recipe memory stores therein a plurality of temperature recipes which are prepared for every number and arranged position of said objects, and said controller selects a temperature recipe corresponding to information on the number and arranged position of said objects to be housed in said heating furnace, from said plurality of temperature recipes to control said plurality of heaters in accordance with the selected temperature recipe.

6. A batch type heat treatment system as set forth in claim 5, wherein a space in said heating furnace is divided into a plurality of partial zones in arranged directions of said objects, said temperature recipe comprises a plurality of sub-recipes which are prepared for every one of said plurality of partial zones which are obtained by dividing the space in said heating furnace in the arranged directions of said objects, and said controller controls said plurality of heaters in accordance with said sub-recipes corresponding to each of said partial zones.

7. A batch type heat treatment system as set forth in claim 6, wherein said controller controls said plurality of heaters so that the difference between a set of wafer temperatures, which have been estimated referring to said temperature estimating models, and a set of temperatures, which are indicated by said sub-recipes of said plurality of partial zones, is minimum.

8. A batch type heat treatment system as set forth in claim 1, wherein said information on the number and arranged position of said objects is inputted from an operation panel.

9. A batch type heat treatment system as set forth in claim 1, wherein said information on the number of said objects is automatically acquired by a number counter for counting the number of said objects.

10. A method for controlling a batch type heat treatment system having a furnace for housing stationary objects to be processed, a plurality of heaters which are arranged for heating each of a plurality of regions of said heating furnace, and a plurality of temperature sensors for detecting the temperature of each of said plurality of regions, said method comprising:

a model storing step of storing therein a plurality of temperature estimating models, which have been prepared in accordance with the number and arranged position of said objects, for estimating the temperatures of said objects in said heating furnace from the outputs of said plurality of temperature sensors;

an information acquiring step of acquiring information on the number and arranged position of said objects housed in said heating furnace;

a temperature estimating step of selecting a temperature estimating models corresponding to the acquired information, from said plurality of temperature estimating model to estimate the temperatures of said objects from the outputs of said plurality of temperature sensors on the basis of the selected temperature estimating model; and a heater control step of controlling said plurality of heaters in accordance with the estimation of the temperatures of said objects so that the temperatures of said objects equal target temperature values.

11. A method for controlling a batch type heat treatment system as set forth in claim 10, wherein each of said temperature estimating models has a plurality of sub-models for controlling the heaters while estimating the temperature of the objects, in order to cause the estimated temperatures of said objects to approach said target temperature values, said sub-models are set for every temperature zone, and said temperature estimating step selects one of said sub-models corresponding to the temperatures of said objects.

12. A method for controlling a batch type heat treatment system as set forth in claim 10, wherein a space in said heating furnace is divided into a plurality of partial zones in arranged directions of said objects, said temperature recipe comprises a plurality of sub-recipes which are prepared for every one of said plurality of partial zones which are obtained by dividing the space in said heating furnace in the arranged directions of said objects, and said heater control step controls said plurality of heaters in accordance with said sub-recipes corresponding to each of said partial zones.

13. A method for controlling a batch type heat treatment system as set forth in claim 10, wherein said heater control step controls said plurality of heaters so that the difference between a set of wafer temperatures, which have been estimated referring to said temperature estimating models, and a set of temperatures, which are indicated by said sub-recipes of said plurality of partial zones, is minimum.

14. A heat treatment method using a batch type heat treatment system having a furnace for housing stationary objects to be processed, a plurality of heaters which are arranged for heating each of a plurality of regions of said heating furnace, and a plurality of temperature sensors for detecting the temperature of each of said plurality of regions, said heat treatment method comprising:

a model reading step of selecting and reading a temperature estimating model corresponding to information on the number and arranged position of said objects housed in said heating furnace, from a model memory for storing therein a plurality of temperature estimating models which have been prepared in accordance with the number and arranged position of said objects, for estimating the temperatures of said objects in said heating furnace;

a recipe reading step of reading a temperature recipe corresponding to the kind of a heat treatment, which is to be carried out with respect to said objects, from a recipe memory for storing therein a plurality of temperature recipes indicative of a time-varying temperature pattern which is to be applied to said objects;

a temperature estimating step of estimating the temperatures of said objects from the outputs of said plurality of temperature sensors on the basis of the temperature estimating model which has been read at said model reading step; and a heater control step of controlling said plurality of heaters so that the temperatures of said objects estimated at said temperature estimating step equal target temperature values indicated by the read temperature recipe.

15. A heat treatment method as set forth in claim 14, wherein each of said temperature estimating models has a plurality of sub-models for controlling the heaters while estimating the temperature of the objects, in order to cause the estimated temperatures of said objects to approach said target temperature values, said sub-models are set for every temperature zone, and said model reading step selects one of said sub-models corresponding to the temperatures of said objects.

16. A heat treatment method as set forth in claim 14, wherein a space in said heating furnace is divided into a plurality of partial zones in arranged directions of said objects, said temperature recipe comprises a plurality of sub-recipes which are prepared for every one of said plurality of partial zones which are obtained by dividing the space in said heating furnace in the arranged directions of said objects, and said heater control step controls said plurality of heaters in accordance with said sub-recipes corresponding to each of said partial zones.

17. A heat treatment method as set forth in claim 16, wherein said heater control step controls said plurality of heaters so that the difference between a set of wafer temperatures, which have been estimated referring to said temperature estimating models, and a set of temperatures, which are indicated by said sub-recipes of said plurality of partial zones, is minimum.

* * * * *